United States Patent
Tseng et al.

(10) Patent No.: US 11,217,508 B2
(45) Date of Patent: Jan. 4, 2022

(54) LEAD STRUCTURE OF CIRCUIT WITH INCREASED GAPS BETWEEN ADJACENT LEADS

(71) Applicant: Sitronix Technology Corp, Jhubei (TW)

(72) Inventors: Kuo-Wei Tseng, Jhubei (TW); Po-Chi Chen, Jhubei (TW); Jui-Hsuan Cheng, Jhubei (TW)

(73) Assignee: Sitronix Technology Corp., Jhubei (TW)

( * ) Notice: Subject to any disclaimer, the term of this patent is extended or adjusted under 35 U.S.C. 154(b) by 0 days.

(21) Appl. No.: 16/161,318

(22) Filed: Oct. 16, 2018

(65) Prior Publication Data

US 2019/0115285 A1 Apr. 18, 2019

Related U.S. Application Data

(60) Provisional application No. 62/572,613, filed on Oct. 16, 2017.

(51) Int. Cl.
*H01L 23/495* (2006.01)
*H01L 23/00* (2006.01)
(Continued)

(52) U.S. Cl.
CPC ...... *H01L 23/4952* (2013.01); *H01L 23/4985* (2013.01); *H01L 23/49524* (2013.01);
(Continued)

(58) Field of Classification Search
CPC .......... H01L 23/4952; H01L 23/49541; H01L 23/49582; H01L 24/17; H01L 24/14;
(Continued)

(56) References Cited

U.S. PATENT DOCUMENTS

| | | | |
|---|---|---|---|
| 6,194,667 B1 * | 2/2001 | Jimarez | H05K 3/3452 174/261 |
| 2005/0082647 A1 | 4/2005 | Lee et al. | |

(Continued)

FOREIGN PATENT DOCUMENTS

| | | |
|---|---|---|
| JP | S57199228 U | 12/1982 |
| JP | S63276235 A | 11/1988 |

(Continued)

*Primary Examiner* — Kyoung Lee
*Assistant Examiner* — Christina A Sylvia
(74) *Attorney, Agent, or Firm* — Rosenberg, Klein & Lee

(57) ABSTRACT

The present invention discloses a lead structure of the circuit, which comprises a first lead and a second lead. The first lead includes a first bump connecting part and a first lead segment. The first lead segment is connected to the first bump connecting part. The width of the first lead segment is smaller than the width of the first bump connecting part. The second lead is adjacent to the first lead and there is a lead gap therebetween. The second lead also includes a second bump connecting part and a first lead segment. The first lead segment of the second lead is connected to the second bump connecting part. The second bump connecting part and the first bump connecting part are arranged staggeredly. The second bump connecting part is adjacent to the first lead segment of the first lead.

16 Claims, 6 Drawing Sheets

(51) Int. Cl.
*H01L 23/498* (2006.01)
*H01L 23/60* (2006.01)

(52) U.S. Cl.
CPC .. *H01L 23/49541* (2013.01); *H01L 23/49582* (2013.01); *H01L 24/14* (2013.01); *H01L 24/17* (2013.01); *H01L 23/60* (2013.01); *H01L 24/13* (2013.01); *H01L 24/16* (2013.01); *H01L 24/32* (2013.01); *H01L 24/73* (2013.01); *H01L 24/81* (2013.01); *H01L 2224/13111* (2013.01); *H01L 2224/13144* (2013.01); *H01L 2224/1416* (2013.01); *H01L 2224/14154* (2013.01); *H01L 2224/16227* (2013.01); *H01L 2224/1716* (2013.01); *H01L 2224/17154* (2013.01); *H01L 2224/26175* (2013.01); *H01L 2224/32225* (2013.01); *H01L 2224/73204* (2013.01); *H01L 2224/8146* (2013.01); *H01L 2224/81411* (2013.01); *H01L 2224/81439* (2013.01); *H01L 2224/81444* (2013.01); *H01L 2224/81447* (2013.01); *H01L 2224/92125* (2013.01); *H01L 2924/15192* (2013.01); *H01L 2924/3511* (2013.01); *H01L 2924/381* (2013.01)

(58) Field of Classification Search
CPC ........ H01L 2224/16227; H05K 3/3452; H05K 2201/0989; H05K 2201/10674
See application file for complete search history.

(56) References Cited

U.S. PATENT DOCUMENTS

| | | | | |
|---|---|---|---|---|
| 2005/0098884 | A1* | 5/2005 | Cheng | H01L 23/49572 257/737 |
| 2005/0110164 | A1* | 5/2005 | Pendse | H01L 21/563 257/778 |
| 2006/0255473 | A1* | 11/2006 | Pendse | H01L 21/4853 257/778 |
| 2008/0119061 | A1* | 5/2008 | Hwang | H01L 23/49572 439/55 |
| 2011/0049688 | A1 | 3/2011 | Sasaki | |
| 2015/0189750 | A1* | 7/2015 | Jang | H01L 24/14 174/261 |

FOREIGN PATENT DOCUMENTS

| | | |
|---|---|---|
| JP | 2006229018 A | 8/2006 |
| JP | 2011119758 A | 6/2011 |
| KR | 20050033111 A | 4/2005 |
| TW | I226111 B | 1/2005 |
| TW | 200711098 A | 3/2007 |
| TW | 200812039 A | 3/2008 |

* cited by examiner

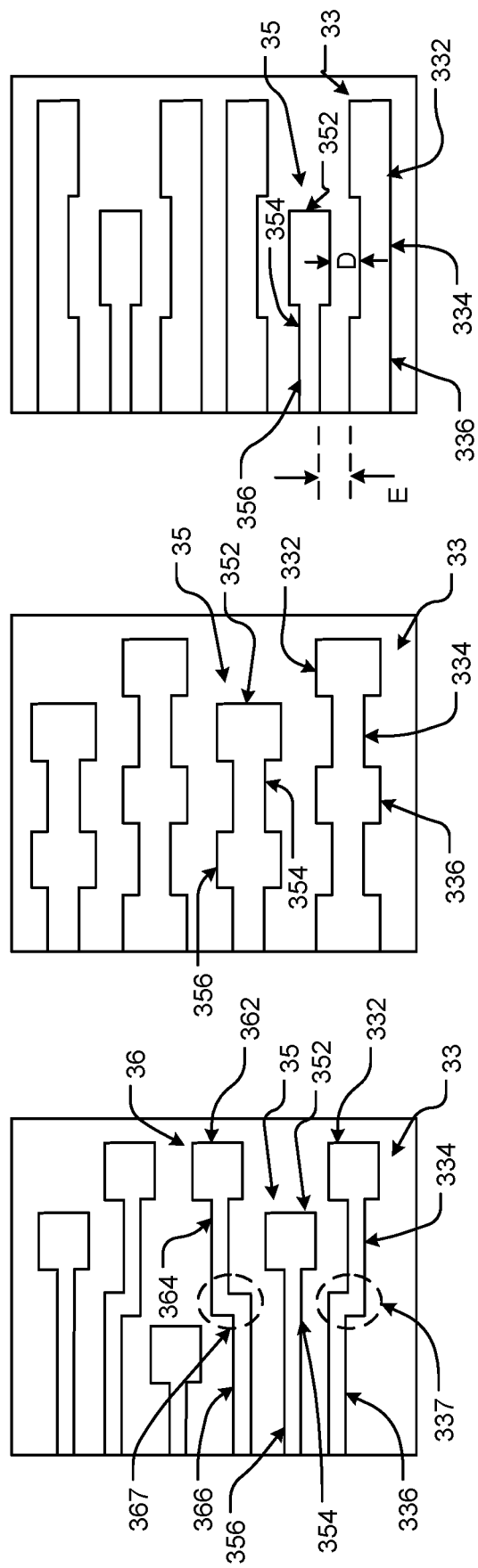

LEAD STRUCTURE OF CIRCUIT WITH INCREASED GAPS BETWEEN ADJACENT LEADS

FIELD OF THE INVENTION

The present invention relates generally to a lead structure of the circuit, and particularly to a lead structure of the circuit with increased gaps between adjacent leads for improving the production stability and complying with the fine pitch requirement.

BACKGROUND OF THE INVENTION

Owing to the increased demand in the functionality of electronic devices in recent years, the lead count of an integrated circuit (IC) in electronic devices increases accordingly, making the gaps between adjacent leads narrower. Thereby, in the packaging process for ICs, in order to fabricate more leads in a confined space for meeting the development trend of a high lead count in ICs, the lead structure in packaging needs to achieve the target of fin pitch for shrinking the gaps between adjacent leads. Unfortunately, since the gaps between adjacent leads are narrow, it is difficult for etchants to enter. Consequently, etching is difficult, or even the lead structure cannot be formed by etching. In the related documents of packing technology, for example, the US Patent Publication Number U.S. Pat. No. 6,222,738 B1 and the China Patent Publication Number CN1099135C2, neither technical content targeting at fine pitch nor solution for the etching problem is provided. Thereby, in the current packing process for ICs, the limitation of gaps in lead structures has limited chip design. For example, general packing houses will require the minimum pitch, such as 20 μm, of a lead structure for ensuring sufficient gaps for adjacent leads. This requirement will limit the lead count in a limited circuit space.

Accordingly, the present invention provides a lead structure of the circuit capable of being formed stably without the need of modifying process parameters, upgrading machines, and increasing manufacturing costs. In addition, the formed lead structure of the circuit can stably comply with the target of fine pitch requirement. Thereby, the production yield can be improved.

SUMMARY

An objective of the present invention is to provide a lead structure of the circuit, which adopts a necking design to increase the gap between adjacent leads. Thereby, the lead structure can be fabricated stably and complying with the fine pitch requirement, and hence the production yield can be improved.

The present invention discloses a lead structure of the circuit, which comprises a first lead and a second lead. The first lead includes a first bump connecting part and a first lead segment. The first lead segment is connected to the first bump connecting part. The width of the first lead segment is smaller than the width of the first bump connecting part. The second lead is adjacent to the first lead and there is a lead gap therebetween. The second lead also includes a second bump connecting part and a first lead segment. The first lead segment of the second lead is connected to the second bump connecting part. The second bump connecting part and the first bump connecting part are arranged staggeredly. The second bump connecting part is adjacent to the first lead segment of the first lead.

BRIEF DESCRIPTION OF THE DRAWINGS

FIG. 4 shows a schematic diagram of the lead structure of the circuit according to a second embodiment of the present invention;

FIG. 5 shows a schematic diagram of the lead structure of the circuit according to a third embodiment of the present invention;

FIG. 6 shows a schematic diagram of the lead structure of the circuit according to a fourth embodiment of the present invention;

DETAILED DESCRIPTION

In the specifications and subsequent claims, certain words are used for representing specific devices. A person having ordinary skill in the art should know that hardware manufacturers might use different nouns to call the same device. In the specifications and subsequent claims, the differences in names are not used for distinguishing devices. Instead, the differences in functions are the guidelines for distinguishing. In the whole specifications and subsequent claims, the word "comprising" is an open language and should be explained as "comprising but not limited to". Besides, the word "couple" includes any direct and indirect electrical connection. Thereby, if the description is that a first device is coupled to a second device, it means that the first device is connected electrically to the second device directly, or the first device is connected electrically to the second device via other device or connecting means indirectly.

In order to make the structure and characteristics as well as the effectiveness of the present invention to be further understood and recognized, the detailed description of the present invention is provided as follows along with embodiments and accompanying figures.

The package types of driving chips include tap carrier package (TCP), chip on film (COF) package, and chip on glass (COG) package. In the following, the COF package is selected as an embodiment for describing the lead structure of the circuit according to the present invention. Nonetheless, the lead structure of the circuit according to the present invention can be also applied to other package types. Their embodiments will not be further described.

Figure 1:
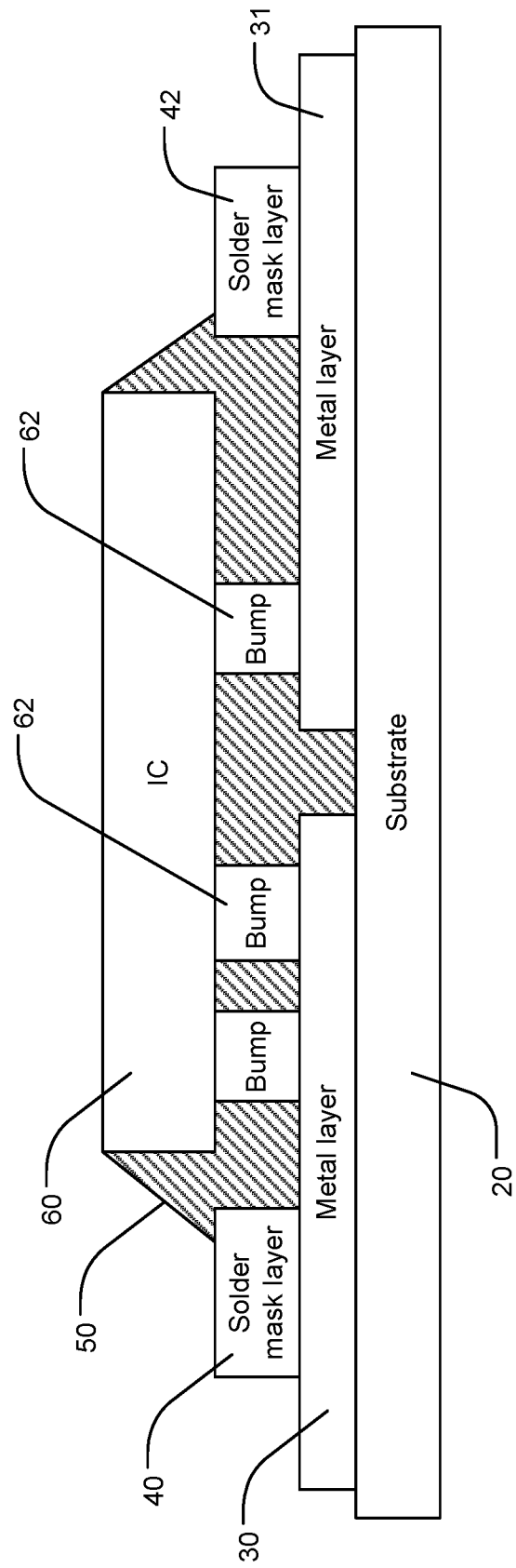
FIG. 1 shows a side view of the chip on film package according to an embodiment of the present invention.

Please refer to FIG. 1, which shows a side view of the chip on film package according to an embodiment of the present invention. As shown in the figure, a package structure 10 comprises a substrate 20, a plurality of metal layers 30, 31 located on both sides of the substrate 20, a plurality of solder mask layers 40, 42, and a glue layer 50, and is used for packaging an IC 60. A plurality of bumps 62 is formed on the soldering pads (not shown in the figure) at the bottom of the IC 60. The substrate 20 is preferably a flexible substrate. Therefore, the material of the substrate 20 is preferably to employ bendable material such as polyimide (PI), and the thickness of the substrate 20 can be made thinner to make it bendable. The materials of the plurality of metal layers 30, 31 can be conductor with good signal transmission characteristic such a copper (Cu), gold (Au), silver (Ag), iron (Fe), tin (Sn) . . . etc. The material of the plurality of bumps 62 can be gold (Au) or the alloy of tin and lead (Sn/Pb). The plurality of metal layers 30, 31 on both sides of the substrate 20 are the lead structure of the circuit formed by etching and used for transmitting signals. The plurality of bumps 62 is connected to the plurality of metal layers 30, 31, respectively. In other words, the plurality of bumps 62 is the bridges connecting the IC 60 and the plurality of metal layers 30, 31. The plurality of solder mask layers 40, 42 cover partial regions of the plurality of metal layers 30, 31. Namely, they cover a partial structure of the lead structure of the circuit, for example, the lead segments not used for soldering in the lead structure of the circuit, for protecting the lead structure of the circuit from, for example, being oxidized or short circuit caused by attachment of solders. The glue layer 50 pots the space between each of the plurality of solder mask layers 40, 42, and covers the substrate 20, the plurality of metal layers 30, 31 and the plurality of bumps 62 between the plurality of solder mask layers 40, 42. The glue layer 50 further pots a portion of the plurality of solder mask layers 40, 42 and the bottom and side surfaces of the IC 60. The glue layer 50 will be hardened after the baking process and thus protecting the plurality of metal layers 30, 31 (the lead structure), the plurality of bumps 62, and the IC 60 covered by the glue layer 50. The lead segments of the lead structure located between the plurality of solder mask layers 40, 42 can be named as inner leads. The lead segments of the lead structure not located between the plurality of solder mask layers 40, 42 can be named as outer leads and used for connecting to external circuits.

Figure 2:
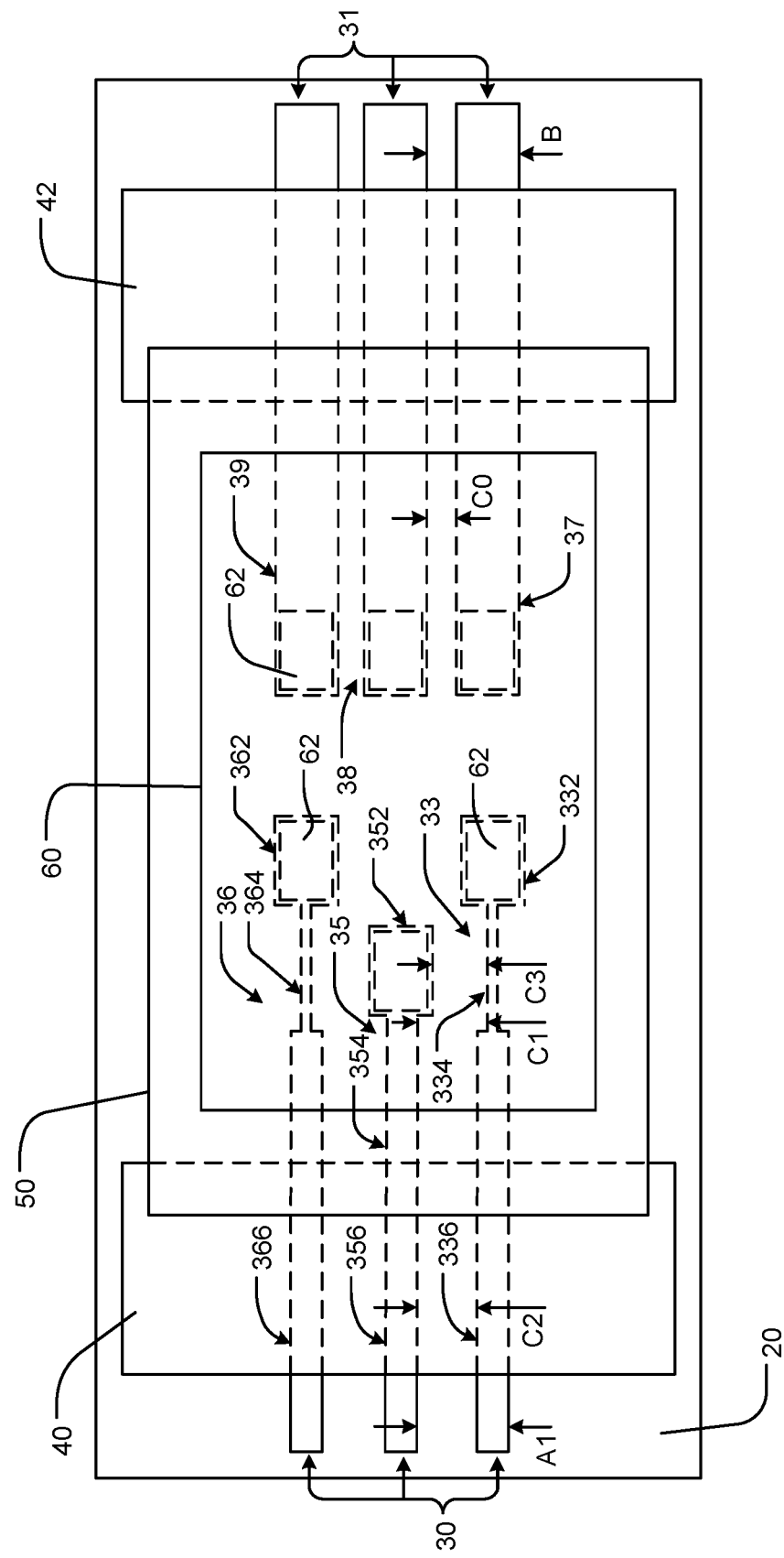
FIG. 2 shows a top view of the lead structure of the circuit according to a first embodiment of the present invention applied to the chip on film package.

Please refer to FIG. 2, which shows a top view of the lead structure of the circuit according to a first embodiment of the present invention applied to the chip on film package. To illustrate clearly the difference between the lead structure of the circuit according to the present invention and the one according to the prior art, the lead structure of the circuits according to the present invention and to the prior art are shown concurrently on the COF package 10 in FIG. 2. As shown in the figure, the left metal layer 30 is the lead structure of the circuit according to the present invention after etching, including a plurality of leads 33, 35, 36 adjacent to one another. Besides, there is a lead gap between adjacent leads, making the leads not contacting one another. For example, the second lead 35 is adjacent to and not contacting the first lead 33. The right metal layer 31 is the lead structure of the circuit according to the prior art after etching and includes a plurality of leads 37, 38, 39 adjacent to one another. There is a lead gap between adjacent leads and thus making the leads not contacting one another. Each of the plurality of leads 37, 38, 39 is strip-shaped. One end of the plurality of leads 37, 38, 39 corresponds to the bottom of the IC 60 and is connected to the plurality of bumps 62 at the bottom of the IC 69, respectively. Thereby, the width of the plurality of leads 37, 38, 39 is greater than the width of the plurality of bumps 62. The other end of the plurality of leads 37, 38, 39 is not covered by the solder mask layer 42 for connecting to the external circuit (not sown in the figure).

Please refer again to FIG. 2. The first lead 33 according to the present invention includes a first bump connecting part 332, a first lead segment 334, and a second lead segment 336. The first lead segment 334 is connected between the first bump connecting part 332 and the second lead segment 336. The second lead 35 includes a second bump connecting part 352, a first lead segment 354, and a second lead segment 356. The first lead segment 354 is connected between the second bump connecting part 352 and the second lead segment 356. The third lead 36 includes a third bump connecting part 362, a first lead segment 364, and a second lead segment 366. The first lead segment 364 is connected between the third bump connecting part 362 and the second lead segment 366. According to the present embodiment, the third lead 36 is identical to the first lead 33. It is not limited that the third lead 36 must be identical to the first lead 33. The plurality of bump connecting parts 332, 352, 362 of the leads 33, 35, 36 described above is connected to the plurality of bumps 62 at the bottom of the IC 60, respectively. One end of the plurality of second lead segments 336, 356, 366 of the plurality of leads 33, 35, 36 is not covered by the solder mask layer 40 for connecting to the external circuits.

According to the embodiment in FIG. 2, the width of the first lead segment 334 and the width of the second lead segment 336 of the first lead 33 are smaller than the width of the first bump connecting part 332. The width of the first lead segment 354 and the width of the second lead segment 356 of the second lead 35 are smaller than the width of the second bump connecting part 352. The width of the first lead segment 364 and the width of the second lead segment 366 of the third lead 36 are smaller than the width of the third bump connecting part 362. Due to the necking design in the lead structure of the circuit according to the present invention, the lead gap between the first lead 33 and the second lead 35 is increased. For example, the width of the first lead segment 334 and the width of the second lead segment 336 of the first lead 33 are smaller than the width of the first bump connecting part 332. Thereby, the gap C1 between the first lead segment 334 of the first lead 33 and the first lead segment 354 of the second lead 35 and the gap C2 between the second lead segment 336 of the first lead 33 and the second lead segment 356 of the second lead 35 are increased. In addition, the second bump connecting part 352 can be located on one side of the first lead segment 334 and adjacent to the first lead segment 334. It means that the first bump connecting part 332 and the second bump connecting part 352 can be arranged staggeredly (along the horizontal direction in the figure), and thus further increasing the lead gap between the first lead 33 and the second lead 35 such as the gap C3 between the second bump connecting part 352 of the second lead 35 and the first lead segment 334 of the first lead 33. The above stagger arrangement means that the first bump connecting part 332 is located ahead of the second bump connecting part 352 (along the horizontal direction in the figure). The second bump connecting part 352 can be adjacent or not adjacent to the first bump connecting part 332. Likewise, the second bump connecting part 352 is also adjacent to the first lead segment 364 of the third lead 36. The third bump connecting part 362 and the second bump connecting part 352 are arranged staggeredly (along the horizontal direction in the figure) as well for increasing the lead gap between the second lead 35 and the third lead 36.

Please refer again to FIG. 2. Although according to the present embodiment, the width of the second lead segment 336 of the first lead 33 is greater than the width of the first lead segment 334, it is not limited that the width of the second lead segment of each lead must be greater than the width of the first lead segment. For example, the width of the second lead segment 356 of the second lead 35 can be designed to be identical to the width of the first lead segment 354 thereof. According to another embodiment of the present invention, the width of the second lead segment 336 of the first lead 33 is not required to be smaller than the width of the first bump connecting part 332; the width of the first lead segment 354 of the second lead 35 and the width of the second lead segment 356 are not required to be smaller than the width of the second bump connecting part 352; and the width of the second lead segment 366 of the third lead 36 is not required to be smaller than the width of the third bump connecting part 362.

To compare clearly the difference between the lead structures of the circuits according to the present invention and to the prior art, the pitches in the lead structures of the circuits according to the present invention and to the prior art shown in FIG. 2 are identical. For example, the pitches A1, B are both 18 µm for complying with the fine pitch requirement. The pitch is generally defined as the sum of the gap between two adjacent lead structures and the width of one of the lead structures. Thereby, the pitch A1 can be the sum of the width of the second lead segment 336 and the gap C2; the pitch B is the sum of the width of the lead 37 according to the prior art and the gap C0. According to FIG. 2, the gap C0 between the leads 37, 38 of the lead structure of the circuit according to the prior art is apparently smaller than the gaps C1, C2, C3 between the first lead 33 and the second lead 35 of the lead structure of the circuit according to the present invention. Thereby, while forming the leads 37, 38 according to the prior art by etching, it is difficult for the etchant to enter the space between the leads 37, 38 and hence possibly resulting in incomplete etching. It means that stable lead structures cannot be formed and the problem of low production yield will occur. On the contrary, because the gaps C1, C2, C3 between the first and second leads 33, 35 are wider, the etchant can enter the gaps completely. Thereby, the first and second leads 33, 35 can be formed stably and thus improving the production yield. Further, it will decrease the use of material of the lead structure to decrease the cost by taking the lead structure of the circuit according to the present invention. Moreover, given the same pin count, after the pitch A1 of the lead structure of the circuit according to the present invention is shrunk, for example, less than 18 µm, the gaps between the plurality of soldering pads on the IC 60 can be further shrunk. By further shrinking the area of the IC 60, more chips can be formed on a wafer and hence increasing the value of a single wafer. Besides, by using the stagger arrangement of the bump connecting parts of adjacent leads, the gap between the bump connecting parts of adjacent leads can be increased and hence lowering the probability of atom migration between the bump connecting parts. Further, due to the fact that substrate 20 of the present embodiment can be the flexible substrate, by increasing the gaps between the leads, the probability of short-circuit, disconnection or being damaged of leads while the substrate 20 is deformed will substantially decrease. As such, after the lead structure of the circuit according to embodiments of the present invention is made, it can withstand multiple bends without damaging the leads.

Figure 3:
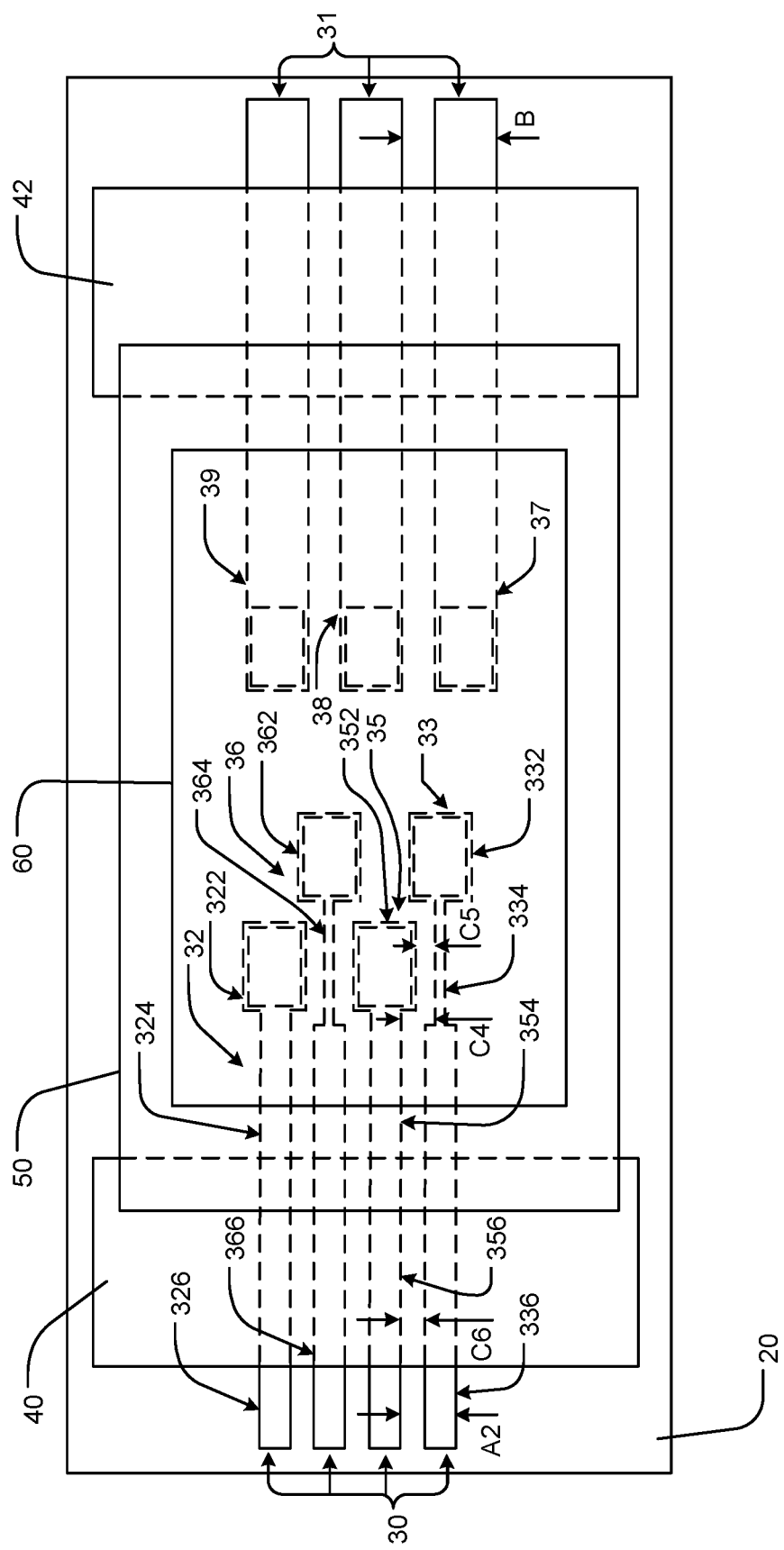
FIG. 3 shows a top view of the lead structure of the circuit according to a second embodiment of the present invention applied to the chip on film package.

Please refer to FIG. 3, which shows a top view of the lead structure of the circuit according to a second embodiment of the present invention applied to the chip on film package. According to the embodiment in FIG. 2, because the lead structure of the circuit according to the present invention adopts the necking design, given the same pitch, the gap in the lead structure of the circuit according to the present invention is apparently greater than the gap in the lead structure of the circuit according to the prior art. Thereby, by shrinking the gaps, the pitch of leads can be further reduced and hence enhancing the utilization efficiency of the circuit area. According to the embodiment in FIG. 3, the pitch A2, for example, 14 µm, of the lead structure of the circuit according to the present invention located on the left side of the substrate 20 is smaller than the pitch A1 according to the embodiment in FIG. 2. On the other hand, the pitch B of the lead structure of the circuit according to the prior art located on the right side of the substrate 20 is the same as the pitch B shown in FIG. 2. Thereby, on the same area occupied by the three leads 37, 38, 39 according to the prior art, the four leads 32, 33, 35, 36 according to the present invention can be formed.

Furthermore, once the necking design is applied to the first lead segment 334, the second bump connecting part 352 can be located at the necking portion of the first lead segment 334 and adjacent to the first lead segment 334. Thereby, the first bump connecting part 332 and the second bump connecting part 352 are arranged staggeredly. The stagger arrangement means that the second bump connecting part 352 is not adjacent to the first bump connecting part 332. In addition, the necking-designed first lead segment 334 does not exceed the range of the glue layer 50. Thereby, the first lead segment won't be damaged by external stress easily. Besides, after the widths of the lead segments 334, 336, 354, 356, 364, 366, 324, 326 are shrunk, the areas occupied by them will be reduced accordingly, leading to a reduction of capacitive plate effect. In addition, in the general etching process, if the gap between two adjacent leads is too narrow, etching can be incomplete or unachievable, making the two adjacent lead short-circuit. In the lead structure of the circuit according to the prior art, the gap between two adjacent leads is limited. There is little room for further shrinkage. Accordingly, it is difficult to form a lead structure of the circuit complying with the severe fine pitch requirement such as a fine pitch of 14 µm. Contrarily, compared to the lead structure of the circuit according to the prior art, the necking design applied in the lead structure of the circuit according to the present invention can increase the gap between two adjacent leads. Thereby, the lead structure of the circuit according to the present invention can be formed stably and complying with severe fine pitch requirement. In practice, because the widths of the leads 37, 38 of the lead structure of the circuit according to the prior art must be greater than the width of the bump 62, if the pitch of the leads 37, 38 is made to be smaller than 14 µm, the gap C0 between the leads 37, 38 must be as small as 6 µm. Such a narrow gap in a lead structure will significantly increase the probability of incomplete etching. In general, the yield of the lead structure of the circuit according to the prior art with the gape B of 14 µm formed by etching is not more than 10%, and mass production cannot be achieved at all. The yield of the lead structure of the circuit according to the present invention with the gape A2 of 14 µm formed by etching can be increased substantially and mass production can be achieved. Therefore, by adopting the lead structure of the circuit according to the present invention, the yield can be greatly improved for the requirement of the pitch of 14

μm. Moreover, because the widths of the lead segments are shrunk and the gaps between two adjacent lead segments are widened, the probability of large spike currents can be lowered; the short circuit problem caused by metal residues during the packaging period can be reduced; and the anti-static-charge capability can be enhanced as well.

Please refer again to FIG. 3. The first lead segment 334 is adjacent to the first lead segment 354. There is a gap C4 therebetween. The pitch in this embodiment is the sum of the width of the lead segment and the gap. For example, the pitch is the sum of the width of the first lead segment 334 and the gap C4. The pitch can be between 14 μm and 18 μm and less than 18 μm. Likewise, the sum of the width of the first lead segment 354 and the gap C4 can be between 14 μm and 18 μm and less than 18 μm. In addition, the second bump connecting part 352 is adjacent to the first lead segment 334. There is a gap C5 between the second bump connecting part 352 and the first lead segment 334. Likewise, the sum of the width of the first lead segment 334 and the gap C5 can be between 14 μm and 18 μm and less than 18 μm. Moreover, there is a gap C6 between the second lead segment 336 and the second lead segment 356. Likewise, the sum of the width of the second lead segment 336 and the gap C6 can be between 14 μm and 18 μm and less than 18 μm.

Please refer to FIG. 4, which shows a schematic diagram of the lead structure of the circuit according to a second embodiment of the present invention. As shown in the figure, the widths of the first lead segment 334 and the second lead segment 336 are smaller than the width of the first bump connecting part 332; the widths of the first lead segment 354 and the second lead segment 356 are smaller than the width of the second bump connecting part 352. In addition, the width of the first lead segment 334 is equal to the width of the second lead segment 336; the width of the first lead segment 354 is equal to the width of the second lead segment 356. The side of the first lead segment 334 is flat. The side of the second bump connecting part 352 is parallel with the side of the first lead segment 334 and is flat. Besides, the lead structure according to the embodiment in FIG. 4 can include transition parts such as the transition part 337 of the first lead 33. The first lead segment 334 is connected to the bottom of the transition part 337. The top of the transition part 337 is connected to the second lead segment 336. The structure of the third lead 36 includes a transition part 367. The first lead segment 364 is connected to the top of the transition part 367. The bottom of the transition part 367 is connected to the second lead segment 366. Thereby, the second bump connecting part 352 of the second lead 35 is located between the two first lead segments 334, 364 of the necking design. Nonetheless, the bump connecting parts can be located between two second lead segments of the necking design.

Please refer to FIG. 5, which shows a schematic diagram of the lead structure of the circuit according to a third embodiment of the present invention. As shown in the figure, the width of the first bump connecting part 332 is equal to the width of the second lead segment 336; the width of the second bump connecting part 352 is equal to the width of the second lead segment 356. In addition, the width of the first lead segment 334 is smaller than the width of the second lead segment 336; the width of the first lead segment 354 is smaller than the width of the second lead segment 356. Thereby, according to the embodiments in FIGS. 4 and 5, the width of the second lead segment 336 of the first lead 33 can be greater than the width of the first lead segment 334 and smaller than the width of the first bump connecting part 332.

Please refer to FIG. 6, which shows a schematic diagram of the lead structure of the circuit according to a fourth embodiment of the present invention. As shown in the figure, the second bump connecting part 352 is adjacent to the first lead segment 334. There is a first gap D between the second bump connecting part 352 and the first lead segment 334. The first lead segment 354 is adjacent to the second lead segment 336. There is a second gap E between the first lead segment 354 and the second lead segment 336. The first gap D and the second gap E are identical.

Figure 7:
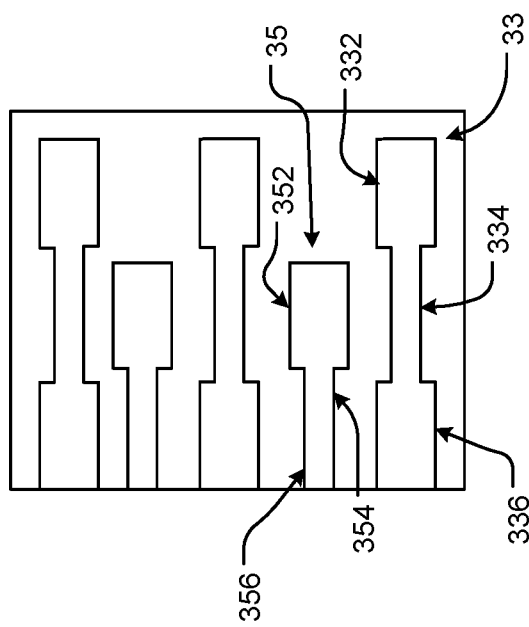
FIG. 7 shows a schematic diagram of the lead structure of the circuit according to a fifth embodiment of the present invention.

Please refer to FIG. 7, which shows a schematic diagram of the lead structure of the circuit according to a fifth embodiment of the present invention. As shown in the figure, the width of the first lead segment 334 is smaller than the width of the first bump connecting part 332; the width of the second lead segment 336 is equal to the width of the first bump connecting part 332; and the widths of the first lead segment 354 and the second lead segment 356 are smaller than the width of the second bump connecting part 352. Besides, the width of the first lead segment 354 is equal to the width of the second lead segment 356.

Figure 8:
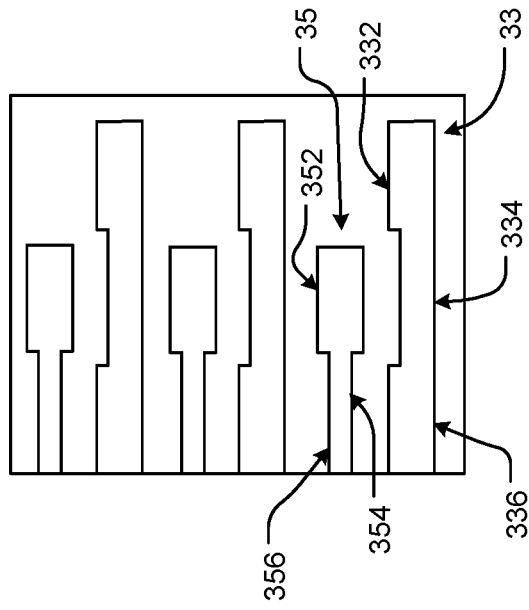
FIG. 8 shows a schematic diagram of the lead structure of the circuit according to a sixth embodiment of the present invention.

Please refer to FIG. 8, which shows a schematic diagram of the lead structure of the circuit according to a sixth embodiment of the present invention. As shown in the figure, the width of the first lead segment 334 is smaller than the width of the first bump connecting part 332; the width of the second lead segment 336 is equal to the width of the first bump connecting part 332; the width of the first lead segment 354 is smaller than the width of the second bump connecting part 352; and the width of the first lead segment 354 is equal to the width of the second lead segment 356.

Figure 9:
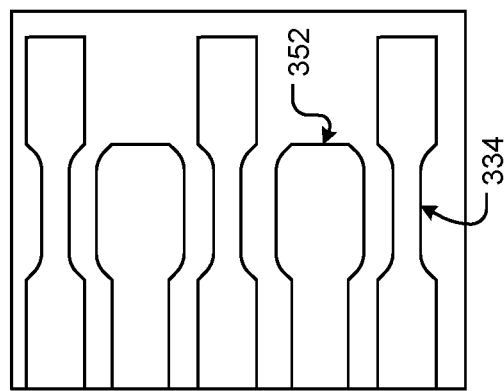
FIG. 9 shows a schematic diagram of the lead structure of the circuit according to a seventh embodiment of the present invention.

In addition to the embodiments in FIGS. 4 to 8, to facilitate expelling glue in the glue potting process, the shape of the leads can be modified to be round and smooth. Please refer to FIG. 9, which shows a schematic diagram of the lead structure of the circuit according to a seventh embodiment of the present invention. As shown in the figure, the shape of the second bump connecting part 352 is modified to be round and smooth for facilitating expelling glue. Besides, the side of the first lead segment 334 is curved. Thereby, the side of the second bump connecting part 352 corresponding to the side of the first lead segment 334 is curved as well.

Figure 10:
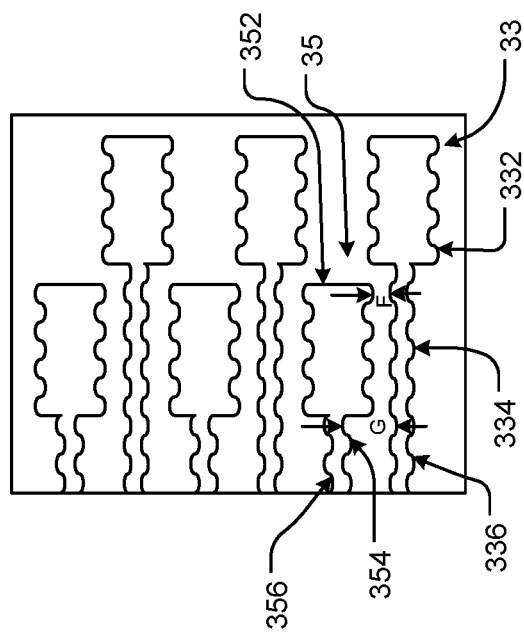
FIG. 10 shows a schematic diagram of the lead structure of the circuit according to an eighth embodiment of the present invention.

Please refer to FIG. 10, which shows a schematic diagram of the lead structure of the circuit according to an eighth embodiment of the present invention. As shown in the figure, the first bump connecting part 332 and the second bump connecting part 352 are modified to be round and smooth for facilitating expelling glue. Besides, the second bump connecting part 352 is adjacent to the first lead segment 334. There is a gap F between the second bump connecting part 352 and the first lead segment 334. The first lead segment 354 is adjacent to the second lead segment 336. There is a gap G between the first lead segment 354 and the second lead segment 336. The gap F is different from the gap G. Furthermore, because the structure of the second lead 35 according to the embodiment in FIG. 10 is located between the necking-designed first lead 33 and third lead 36, the width of the first lead segment 354 of the second lead 35 can be changed to be identical to the width of the second bump connecting part 352. Alternatively, the widths of the first lead segment 354 and the second lead segment 356 of the second lead 35 can be changed to be identical to the width of the second bump connecting part 352. Thereby, the gap F, which is originally different from the gap G, can be modified to be identical to the gap G.

Figure 11:
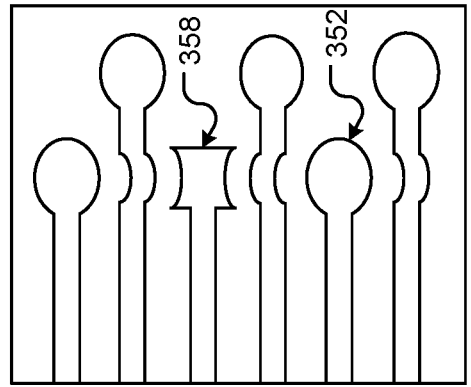
FIG. 11 shows a schematic diagram of the lead structure of the circuit according to a ninth embodiment of the present invention.

Please refer to FIG. 11, which shows a schematic diagram of the lead structure of the circuit according to a ninth embodiment of the present invention. As shown in the figure, the second bump connecting part 352 of the lead structure according to the embodiment in FIG. 11 can have a different shape, such as the shape of the bump connecting part 358. In addition, according to the above various embodiments of the lead structure of the circuit, because the widths of the lead segments are reduced, the gap between a lead segment and an adjacent lead segment or a bump is increased. This increase in spacing is beneficial for heat dissipation. Moreover, the various embodiments of the lead structure of the circuit can be applied interchangeably. For example, the round and smooth bump connecting part shown in FIG. 10 can be applied to FIG. 4; the shape of the bump connecting parts in FIG. 4 can be changed from a rectangle to a round and smooth shape. Alternatively, the condition of the width of the first lead segment 334 smaller than the width of the second lead segment 336 in FIG. 5 can be applied to FIG. 4. Then the original equal widths of the first and second lead segments 334, 336 in FIG. 4 can be changed to be unequal.

To sum up, the present invention discloses a lead structure of the circuit, which comprises a first lead and a second lead. The first lead includes a first bump connecting part and a first lead segment. The first lead segment is connected to the first bump connecting part. The width of the first lead segment is smaller than the width of the first bump connecting part. The second lead is adjacent to the first lead and there is a lead gap therebetween. The second lead also includes a second bump connecting part and a first lead segment. The first lead segment of the second lead is connected to the second bump connecting part. The second bump connecting part and the first bump connecting part are arranged staggeredly. The second bump connecting part is adjacent to the first lead segment of the first lead.

The technology of the lead structure of the circuit according to the present invention can be popularized to all tape houses. Without purchasing additional machines and investing costs, the stability and production yield of the lead structure of the circuit complying with the fine pitch requirement can be improved Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A lead structure of a circuit, comprising:
    a first lead, including a first bump connecting part and a first lead segment, said first lead segment connected to said first bump connecting part, and a width of said first lead segment being smaller than a width of said first bump connecting part; and
    a second lead, adjacent to said first lead, having a lead gap between said second lead and said first lead, including a second bump connecting part and a first lead segment, said first lead segment of said second lead connected to said second bump connecting part, said first bump connecting part and said second bump connecting part arranged staggeredly, and said second bump connecting part adjacent to said first lead segment of said first lead; wherein said first lead further includes a second segment, and said second lead further includes a second lead segment; said first lead segment of said first lead is connected between said second bump connecting part and said second lead segment of said first lead and said first lead segment of said second lead is connected between said second bump connecting part and said second lead segment of said second lead, part of said first and second leads are covered by a solder mask layer, and said second lead segment of said first lead and said second lead segment of said second lead are exposed by said solder mask layer.

2. The lead structure of the circuit of claim 1, wherein a width of said first lead segment of said second lead is smaller than a width of said second bump connecting part.

3. The lead structure of the circuit of claim 1, wherein said first lead segment of said first lead is adjacent to said first lead segment of said second lead; a second segment gap is formed between said first lead segment of said first lead and said first lead segment of said second lead; a sum of a width of said first lead segment of said first lead and said gap is greater than 14 μm and smaller than 18 μm; and a sum of a width of said first lead segment of said second lead and said gap is greater than 14 μm and smaller than 18 μm.

4. The lead structure of the circuit of claim 1, wherein said second bump connecting part is adjacent to said first lead segment of said first lead; a segment gap is formed between said second bump connecting part and said first lead segment of said first lead; a sum of a width of said first lead segment of said first lead and said gap is greater than 14 μm and smaller than 18 μm.

5. The lead structure of the circuit of claim 1, wherein a width of said first lead segment of said first lead and a width of said second lead segment of said first lead are smaller than the width of said first bump connecting part.

6. The lead structure of the circuit of claim 1, wherein a width of said second lead segment is equal to a width of said first bump connecting part.

7. The lead structure of the circuit of claim 1, wherein a width of said second lead segment of said first lead is equal to the width of said first lead segment of said first lead.

8. The lead structure of the circuit of claim 1, wherein a width of said second lead segment of said first lead is greater than said width of said first lead segment of said first lead and smaller than the width of said first bump connecting part.

9. The lead structure of the circuit of claim 1, wherein said second bump connecting part is adjacent to said first lead segment of said first lead; a first gap is formed between said second bump connecting part and said first lead segment of said first lead; said first lead segment of said second lead is adjacent to said second lead segment of said first lead; a second gap is formed between said first lead segment of said second lead and said second lead segment of said first lead; and said first gap is identical to or different from said second gap.

10. The lead structure of the circuit of claim 1, wherein a width of said first lead segment of said second lead and a width of said second lead segment of said second lead are smaller than a width of said second bump connecting part.

11. The lead structure of the circuit of claim 1, wherein a width of said second lead segment is equal to a width of said second bump connecting part.

12. The lead structure of the circuit of claim 1, wherein a width of said second lead segment is equal to a width of said first lead segment of said second lead.

13. The lead structure of the circuit of claim 1, wherein a width of said second lead segment is greater than a width of said first lead segment of said second lead and smaller than a width of said second bump connecting part.

14. The lead structure of the circuit of claim 1, and further comprising a third lead, adjacent to said second lead, having a lead gap formed between said third lead and said second lead, including a third bump connecting part and a first lead segment, said first lead segment of said third lead connected to said third bump connecting part, a width of said first lead segment of said third lead smaller than a width of said third bump connecting part, said third bump connecting part and said second bump connecting part arranged staggeredly, and said second bump connecting part adjacent to said first lead segment of said first lead and said first lead segment of said third lead.

15. A lead structure of a circuit, comprising:
a first lead, including a first bump connecting part and a first lead segment, said first lead segment connected to said first bump connecting part, and a width of said first lead segment being smaller than a width of said first bump connecting part; and
a second lead, adjacent to said first lead, having a lead gap between said second lead and said first lead, including a second bump connecting part and a first lead segment, said first lead segment of said second lead connected to said second bump connecting part, said first bump connecting part and said second bump connecting part arranged staggeredly, and said second bump connecting part adjacent to said first lead segment of said first lead;
wherein a side of said first lead segment of said first lead is curved and a side of said second bump connecting part corresponding to a side of said first lead segment of said first lead is curved; said first lead further includes a second segment, and said second lead further includes a second lead segment; said first lead segment of said first lead is connected between said second bump connecting part and said second lead segment of said first lead and said first lead segment of said second lead is connected between said second bump connecting part and said second lead segment of said second lead, part of said first and second leads are covered by a solder mask layer, and said second lead segment of said first lead and said second lead segment of said second lead are exposed by said solder mask layer.

16. The lead structure of the circuit of claim 1, wherein a side of said first lead segment of said first lead is flat; and a side of said second bump connecting part is parallel with a side of said first lead segment of said first lead and is flat.

* * * * *